(12) United States Patent
Wang

(10) Patent No.: US 7,729,165 B2
(45) Date of Patent: Jun. 1, 2010

(54) SELF-ADAPTIVE AND SELF-CALIBRATED MULTIPLE-LEVEL NON-VOLATILE MEMORIES

(75) Inventor: Lee Wang, Diamond Bar, CA (US)

(73) Assignee: FlashSilicon, Incorporation, Diamond Bar, CA (US)

( * ) Notice: Subject to any disclaimer, the term of this patent is extended or adjusted under 35 U.S.C. 154(b) by 0 days.

(21) Appl. No.: 11/693,610

(22) Filed: Mar. 29, 2007

(65) Prior Publication Data
US 2008/0239820 A1 Oct. 2, 2008

(51) Int. Cl.
*G11C 11/34* (2006.01)
(52) U.S. Cl. ............................. 365/185.03; 365/185.24
(58) Field of Classification Search ............ 365/185.03, 365/185.24
See application file for complete search history.

(56) References Cited
U.S. PATENT DOCUMENTS

| | | | | |
|---|---|---|---|---|
| 5,596,526 | A * | 1/1997 | Assar et al. | 365/185.17 |
| 6,141,256 | A * | 10/2000 | Forbes | 365/185.33 |
| 6,501,680 | B1 * | 12/2002 | Kwon | 365/185.05 |
| 7,330,374 | B2 * | 2/2008 | Mukunoki | 365/185.2 |
| 2006/0239093 | A1 * | 10/2006 | Mukunoki | 365/210 |
| 2007/0087719 | A1 * | 4/2007 | Mandal et al. | 455/299 |

* cited by examiner

*Primary Examiner*—Michael T Tran
(74) *Attorney, Agent, or Firm*—Haynes and Boone, LLP

(57) ABSTRACT

Innovative self-adaptive and self-calibrated methods and structures for Multi-Level Cell (MLC) Non-Volatile Memory (NVM) are disclosed. In the MLC NVM, NVM cells are self-adaptively programmed into a fixed response tolerance window centered at the reference current or voltage corresponding to a selected level gate voltage applied to the controlled gates of NVM cells. The fixed response tolerance window is related to the threshold voltage tolerance window through the sense circuit gain. Properly choosing the sense circuit gain and the response window can control the threshold voltage tolerance window to a desired value. An incremental gate voltage larger than the threshold voltage tolerance window of each NVM cell will guarantee that each NVM cell will produce the correct output current (voltage) in response to applying to the control gate of the NVM cell the stepped voltage corresponding to the level of information stored in the NVM cell. As the stepped voltage applied to the gate of an NVM cell transitions from a voltage just below the threshold voltage of the NVM cell to a voltage corresponding to the threshold voltage of the NVM cell, the output current (voltage) from the NVM cell will pass the current (voltage) transition in comparison with the reference current (voltage). The current (voltage) transition can be detected and converted into the bit-word information representing the voltage level stored in the NVM cell. When the response of an NVM cell falls outside the response tolerance window into the guardband regions, the NVM cell can be re-calibrated and the bit-word information can be saved from fading away.

11 Claims, 7 Drawing Sheets

SELF-ADAPTIVE AND SELF-CALIBRATED MULTIPLE-LEVEL NON-VOLATILE MEMORIES

FIELD OF THE INVENTION

This disclosure relates to self-adaptive and self-calibrated methods and structures for Multiple Level Cell (MLC) Non-Volatile Memory (NVM).

BACKGROUND OF THE INVENTION

Data is stored in an NVM cell by modulating the threshold voltage, $V_{th}$, of the Metal-Oxide-Semiconductor Field Effect Transistor (MOSFET) in the NVM through the injection of charge carriers into the charge-storage layer from the channel of the MOSFET. For example, with respect to a MOSFET, an accumulation of electrons in the floating gate, or in a dielectric layer above the FET channel region, causes the MOSFET to exhibit a relatively high $V_{th}$, while an accumulation of holes in the floating gate, or in a dielectric layer above the FET channel region, causes the MOSFET to exhibit a relatively low $V_{th}$. As illustrated in FIG. 1, the curves for source-to-drain current $I_{ds}$ versus the applied gate voltage $V_g$ under the same drain voltage bias are parallel shifted toward the right along the applying gate voltage axis with higher threshold voltages and vice versa.

The number of bits stored in an NVM cell is determined by the number of resolvable threshold voltage levels, given by Number of Bits=$\log_2$ (number of resolvable threshold voltage levels). The more threshold voltage levels that can be sensed and resolved, the more bits that can be stored in a single NVM cell.

In the conventional MLC NVM, the threshold voltage level sensing has been done by comparing the current (voltage) responses from the memory cells with the current (voltage) response of reference cells, whose threshold voltage levels are pre-trimmed to the reference response current (voltage) levels under the same gate voltage bias. However, due to the non-uniformity of transconductance "$g_m$" (where $g_m = \Delta I_{ds}/\Delta V_g$) and threshold voltage $V_{th}$ for NVM cells inherited from the manufacturing process, the drive current-gate voltage curves are different in slopes (transconductance) and threshold voltages (onset point) for different NVM cells supposedly having the same threshold voltage as illustrated in FIG. 1. In FIG. 1, for each specified threshold voltage level, the solid-line represents the typical cell drive current vs. control gate voltage curve for a cell having the median transconductance, the dashed-line represents this curve for a cell having the maximum transconductance associated with this specified threshold voltage level, and the dotted-line represents this curve for a cell having the minimum transconductance with this specified threshold voltage level). Note that each line group (solid, dashed, dotted) for a specified threshold voltage level represents three different transconductances of the NVM cells. The four line groups shown vary their threshold voltages ($\Delta V_{th0}$, $\Delta V_{th1}$, $\Delta V_{th2}$, and $\Delta V_{th3}$) at four different threshold voltage levels. Specifically, in a population of NVM cells, the variations from cell to cell in aspect ratio (width/length) due to lithography, oxide thickness, or oxide trap density cause the variations in NVM cell transconductance, while the variations in channel impurities or fixed charges cause the variations in NVM cell original threshold voltages before programming. The variations among NVM cells including the reference cells impose a limitation on the number of resolvable threshold voltage levels capable of being achieved especially in the reference cell comparison scheme with a constant gate voltage applied as seen in FIG. 1.

Furthermore, since the memory cells experience more write-erase cycles than the reference cells, the transconductance degradation (smaller slope in the drive current-gate voltage curves) in memory cells become more severe than the transconductance degradation in reference cells. Throughout the device lifetime, other techniques to compensate this effect such as cycling the reference cells or re-adjusting the offsets of the sense amplifiers are required.

Other techniques to sense the drive current in NVM cells using stepped gate voltages to NVM cells have been applied to NOR-type NVM (M. Bauer et al., Intel Corporation, 2005 IEEE International Conference on Integrated Circuit and Technology) and to NAND-type NVM (T. S. June et al., Samsung Electronics, IEEE J. of Solid-State Circuit, Vol. 31, No. 11, pp. 1575, November 1996). In both these techniques, there is no requirement for the pre-trimmed reference cells. The stepped gate voltages are chosen in between specified threshold voltage levels. Besides including the whole threshold voltage distribution associated with a plurality of memory cells programmed to be at a specified threshold voltage level, the stepped voltage increment requires a guard-band voltage between the minimum (maximum) acceptable threshold voltage for a cell programmed to be at the specified level and the maximum (minimum) acceptable threshold voltage for a cell programmed to be at the next lower (higher) specified level such that the whole threshold voltage distributions of the programmed NVM cells for the levels after erase-write cycling and high temperature baking must still reside between the stepped gate voltages as illustrated in FIG. 2 (solid-line original and dotted-line worn). With large enough gate voltage increments to the control gates of NVM cells, combination logic circuitry receiving the responses of sense circuitry can determine the threshold voltage levels of the NVM cells after applying all three stepped voltages and thus determine the binary information represented by the charges stored on the memory cell.

As seen in the stepped gate voltage schemes as illustrated by FIG. 2, the resolvable levels for the MLC NVM are limited by the distribution of the programmed NVM threshold voltages and the guard-band voltages between levels. The width of the threshold voltage distribution associated with the MLC NVM cells for each threshold voltage level depends on the uniformity of programming conditions (speed, background coupling, and noise) and the characteristics of the NVM cells. It has been reported that the distribution of programmed threshold voltages for an NAND-type flash memory is widened by cell program speed, background pattern dependency, read-verification offset, and neighboring floating gate coupling (T. H. Cho et al., Samsung Electronics, IEEE J. of Solid-State Circuit, Vol. 36, No. 11, pp. 1700, November 2001). The widened distribution of threshold voltage after erase-write cycling and high temperature baking (as shown in FIG. 2 by the dotted line curves) strongly depends on the gate dielectric thickness and quality of the NVM cells. These parameters can vary with the NVM cells in a given memory as well as with the NVM cells from memory to memory. Thus FIG. 2 shows in solid lines the distributions of actual threshold voltages associated with four different given threshold voltage levels when the NVM cells are relatively new and have been programmed only a few times and also shows in dotted lines the same distributions after the NVM cells have been used for some time and reprogrammed a large number of times. The dotted line distributions show that with use, the threshold voltages of the NVM cells shift down. To determine the particular threshold voltage associated with a given NVM cell, stepped gate voltages are applied to the control gate of the cell and the drive current $I_{ds}$ is measured. The two stepped gate voltages which result in no $I_{ds}$ current and an $I_{ds}$ current allows a sense amp together with logic circuitry to detect the actual threshold voltage level of the NVM cell and thus the binary information stored in the cell.

In order to ensure that the threshold voltage of some cells in the NVM cell array do not, with age, have a threshold voltage which falls below the lower of the stepped gate voltage for a given reference threshold voltage, a guard band is provided between what is expected to be the lowest threshold voltage for an NVM cell in the memory array and the stepped gate voltage directly below that given reference threshold voltage. A similar guard band is provided between the highest expected threshold voltage associated with a given threshold voltage level and the stepped gate voltage directly above this given threshold voltage level to ensure that no NVM cell in a memory array has an actual threshold voltage which, when the cell is being programmed to the given threshold voltage, exceeds this next higher stepped gate voltage. FIG. 2 shows these guard band voltages in relation to the stepped gate voltages for a typical array of NVM cells.

BRIEF SUMMARY OF THE INVENTION

In order to relieve the threshold voltage level variations due to the non-uniformity of actual threshold voltage from NVM cell to NVM cell and to increase the number of resolvable threshold voltage levels for NVM cells, self-adaptive and self-calibrated methods and structures are disclosed to manage and control the variations of actual threshold voltage from cell to cell in an array of NVM cells. One feature of these methods and structures is to self-adaptively program NVM cells into a fixed response tolerance window centered at the reference current (voltage) with an applied level gate voltage to the NVM cells. The fixed response tolerance window can be converted into the threshold voltage tolerance window through the sense circuit gain relation. Properly selecting the sense circuit gain and choosing the response window can control the threshold voltage tolerance window to a desired value. An incremental gate voltage larger than the threshold voltage tolerance window guarantees that the responses from applying the two stepped voltages with the incremental voltage to the control gates of NVM cells will pass the current (voltage) transition in comparison with the reference current (voltage). The voltage level information stored in the NVM cells can be detected from the transition and converted into bit-word information.

Furthermore, one can also select a gate voltage increment between the reference threshold voltages to include a guard-band voltage to cover the NVM cell transconductance degradation and charge detention due to aging. When the threshold voltage of an NVM cell for a specific threshold voltage level falls out of the tolerance window into the guard-band regions the NVM cell can be recalibrated and restored back to the original response tolerance window. The bit-word information stored in the NVM cells can be saved from fading away.

BRIEF DESCRIPTION OF THE SEVERAL VIEWS OF THE DRAWINGS

For a better understanding of the present invention and to show how it may be carried into effect, reference will now be made to the following drawings, which show the preferred embodiments of the present invention, in which.

DETAILED DESCRIPTION

The present disclosure describes methods and structures to achieve multi-level and multi-bit storage in a single NVM cell. Those of ordinary skill in the art will realize that the embodiments of the present invention described herein in the context of methods and structures are illustrative only and are not intended to be in any way limiting. Other embodiments of the present disclosure will readily suggest themselves to such skilled persons having the benefits of this disclosure.

Figure 3:
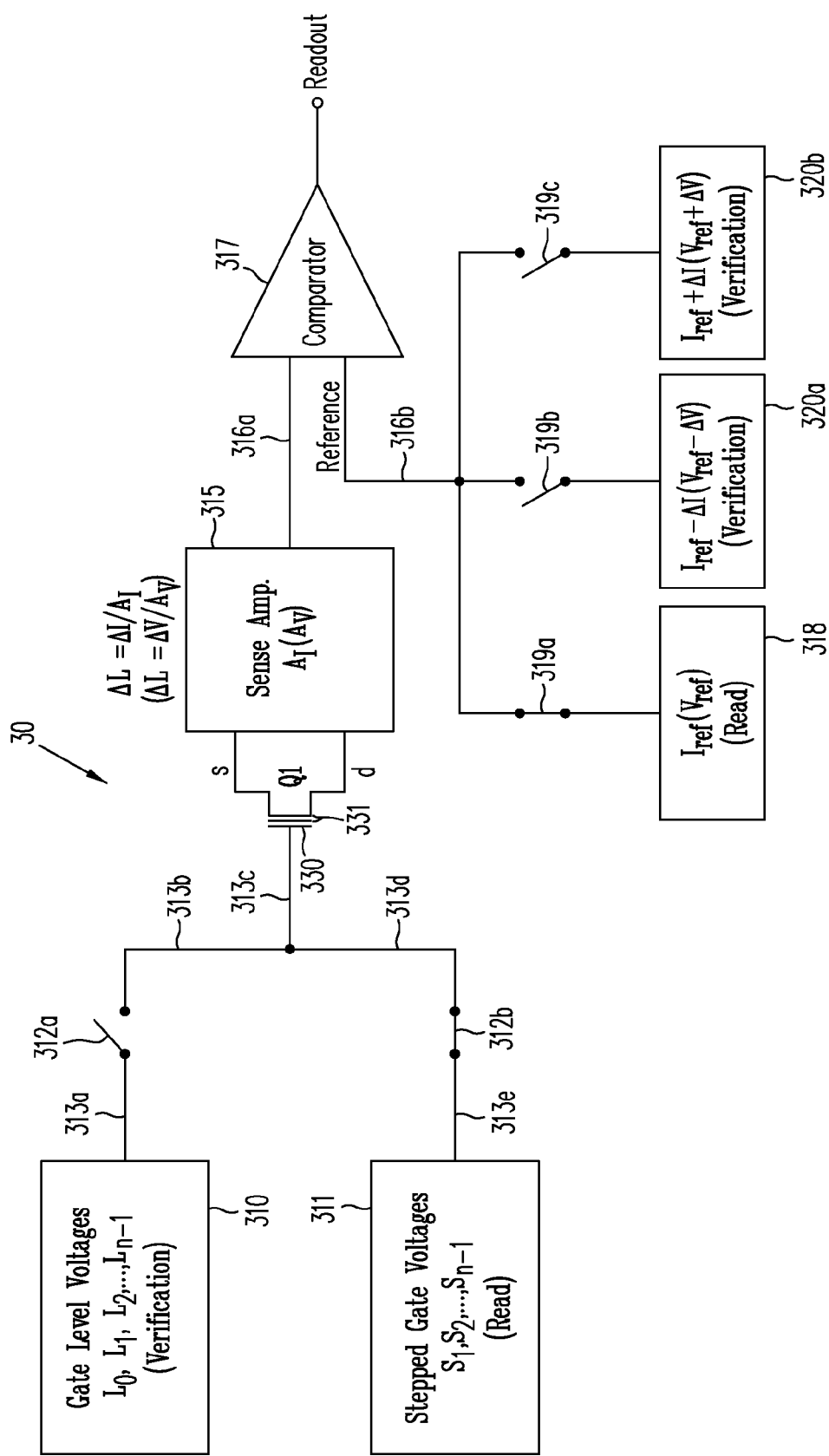
FIG. 3 shows a general block diagram schematic for verification and read in MCL NVM. Appropriate programming and erase schematics for use with this invention, being well-known in the art, are not shown.

FIG. 3 shows the general schematic of a self-adaptive and self-calibrated MLC NVM. The level gate voltages for n levels are given by $L_0, L_1, \ldots, L_{n-1}$ each level being denoted in binary by an m-bit word, where $m=\log_2(n)$. Using the structure shown in FIG. 3, when NVM cells are programmed to a specific level "$L_i$" using standard, well-known programming techniques, the level gate voltage $L_i$ is applied to the control gates of the NVM cells to verify the current (voltage) responses to be within $I_{ref}+/-\Delta I$ ($V_{ref}+/-\Delta V$). The verification is done by switching the reference voltage in the comparator sequentially to the upper bound $I_{ref}+\Delta I$ ($V_{ref}+\Delta V$) and the lower bound $I_{ref}-\Delta I$ ($V_{ref}-\Delta V$) or vice versa. The programming sequence comprises a coarse programming for fast moving the NVM cell threshold voltages to the vicinity of the "$i^{th}$" level and two fine-tune programming (increasing and decreasing) for trimming the NVM cell threshold voltages into the response tolerance window $I_{ref}+/-\Delta I$ ($V_{ref}+/-\Delta V$). Thus if the actual threshold voltage of the NVM cell being programmed is too low compared to the minimum acceptable threshold voltage associated with the specified threshold voltage level $L_i$, then the programming places additional charge on the floating gate or relevant dielectric above the channel region of the NVM cell being programmed until the threshold voltage of this cell is at least above the minimum acceptable threshold voltage level. If the actual threshold voltage of the NVM cell is too high, being above the maximum acceptable threshold voltage associated with the specified threshold voltage level $L_i$, then the programming removes charge on the floating gate or relevant dielectric above the channel region of the NVM cell being programmed until the threshold voltage of this cell is at least below the maximum acceptable threshold voltage level associated with the specified threshold voltage level $L_i$.

Figure 4:
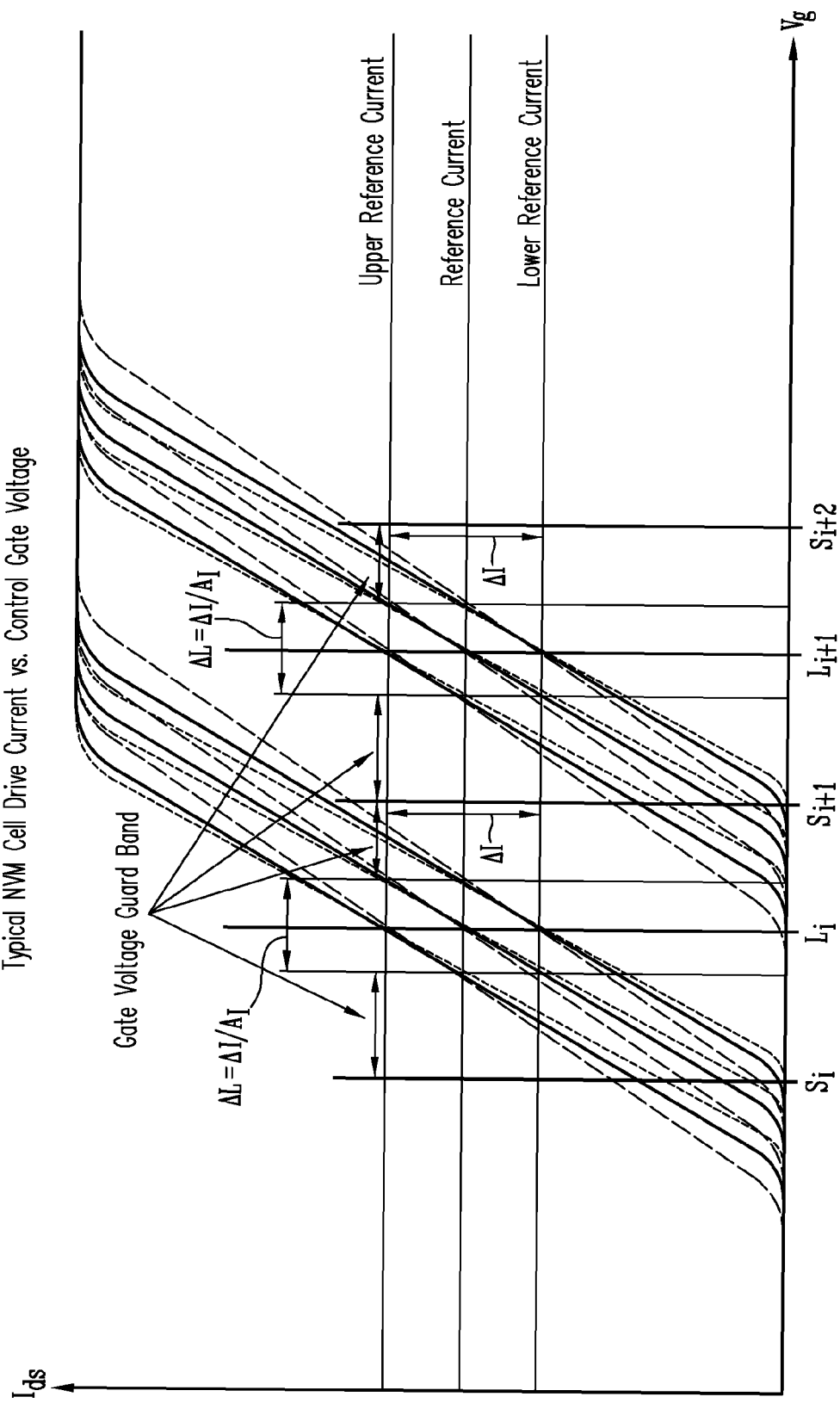
FIG. 4 illustrates the operational principle for the simplest sense circuitry, namely the NVM cell with a constant drain bias using the same transconductance variations (solid-lines, dotted lines, and dashed lines) as presented in FIG. 1. During programming to the level "i", the responses of NVM cells by applying the level gate voltage $L_i$ to the control gate of the NVM cells are verified to be within the upper bound and lower bound of the reference currents ($I_{ref}+\Delta I$ and $I_{ref}-\Delta I$). While obtaining the stored level information in NVM cell, the stepped voltage $S_i$ and $S_{i+1}$ separated by a voltage increment (level gate tolerance voltage $\Delta L_i$ plus a guard-band voltage) are applied to probe the current transition in comparison with reference current $I_{ref}$.

The corresponding tolerance window for the gate voltage, $\Delta L$, is given by the sense circuit gain relation $\Delta L=\Delta I/A_I$ or $\Delta L=\Delta V/A_V$, where $A_I$ and $A_V$ are the sense amplify gain for current and voltage, respectively. FIG. 4 illustrates typical NVM cell drive current vs. control gate voltage curves for the simplest sense amplifier, namely the NVM cells with a fixed drain bias. The sense circuit gain $A_I$ is the transconductance of the NVM cells. The drive-current vs. gate-voltage curves reflecting desired (solid lines), highest acceptable (dashed lines) and lowest acceptable (dotted lines) threshold voltages for each of two specified threshold voltages $L_i$ and $L_{i+1}$ are parallel to each other for the same cells. Since the self-adaptive scheme pulls the threshold voltages of the NVM cells into $\Delta L$ under the constraint of the corresponding response current $\Delta I$, by placing or removing various charges in the floating gates or dielectrics of the cells being programmed, the non-uniformity due to each NVM cell's absolute threshold voltage becomes irrelevant. The absolute quantities of stored charges on the floating gates (dielectrics) of NVM cells vary adaptively by the constraint of requiring the measured output responses to be within the response tolerance window.

The other variation comes from the sense circuit gain variation. Assuming $\Delta A_I$ ($\Delta A_V$) is the variation in sense circuitry gains, the sense circuitry gain for an NVM cell and sense circuit can be written by $A_I=A_{I0}+\Delta A_I$ ($A_V=A_{V0}+\Delta A_V$), where $A_{I0}$ ($A_{V0}$) is the mean of the sense circuitry gains for an array of NVM cells. For the case of simplest sense circuitry in FIG. 4, the gain variations are mainly due to the NVM cell transconductance variations. Thus, the gate voltage tolerance window can be written by $\Delta L=\Delta I/A_{I0}(1+O(\Delta A_I/A_{I0}))$, where $O(\Delta A_I/A_{I0})$ is the higher orders of $(\Delta A_I/A_{I0})$. The effect of gain variations on the gate tolerance window is in the range of higher orders $(\Delta A_I/A_{I0})$. For example, the 10% of transconductance degradation (smaller slope in FIG. 4) used for a typical MOSFET degradation criterion only moves below ~10% of the lower bound of the gate voltage tolerance window.

The stepped gate voltages $S_i$ and $S_{i+1}$ (FIG. 3, block 311) are chosen such that the step voltage increment, $S_{i+1}-S_i$ must be greater than the gate voltage tolerance window $\Delta L$ for the level "i" (corresponding to specified threshold voltage level $L_i$). Under the applied stepped gate voltage condition from $S_i$ to $S_{i+1}$, the responses from the sense circuitry output guarantee to pass the current (voltage) transition in comparison with the reference current (voltage). The output of the comparator 317 will change its state when the transition occurs. The output signal from the output node of the comparator 317 can be applied to recognize the voltage level stored in the NVM cells. By assigning a bit-word to this voltage level, the stored bit-word in the NVM cells can be realized.

In real practice, the increment of stepped voltages requires a guard-band voltage to be included to prevent ambiguity with respect to the boundaries between threshold voltage levels. Other phenomena common to NVM cells such as the stored charge loss due to tunneling or Stress Induced Leakage Current (SLIC) will move the parallel curves downward after some period of storage time. By properly choosing the guard-band voltage and periodic verification of the threshold voltage associated with each NVM cell, the NVM cells containing information represented by stored charge can be recalibrated constantly (i.e., periodically or in accordance with any other algorithm). Thus the bit-word information can be saved from fading away.

As shown in the general schematic of FIG. 3, the control gate electrode 330 associated with the floating gate transistor or charge trapping transistor Q1 of the NVM cell is connectable through switch 312a and conductive leads 313a, 313b, and 313c to source 310 of gate level voltages and through switch 312b and conductive leads 313e, 313d, and 313c to source 311 of stepped gate voltages for verification and read, respectively. The source node "s" and drain node "d" of the floating gate transistor or charge trapping transistor Q1 in the NVM cell are attached to a sense amplifier 315 for sensing the current passed by Q1 in response to each level of gate voltage applied to control gate 330. The output signal from sense amplifier 315 is fed on lead 316a into one input node of comparator 317. The other input node of comparator 317 is connected through lead 316b to any one of three reference currents (voltages) by closing one of switches 319a, 319b and 319c (switch 319a is shown as closed for read operation) for lower bound verification, upper bound verification, and read.

During programming, the output state of comparator 317 is used to verify each NVM cell for adjusting the threshold voltage of that cell such that the response of the sense circuitry is within the lower bound, $I_{ref}-\Delta I$ ($V_{ref}-\Delta V$) and upper bound, $I_{ref}+\Delta I$ ($V_{ref}+\Delta V$) when gate voltage level $L_i$ is applied to the control gate 330 of the transistor Q1. For lower bound verification, the control gate electrode 330 of the NVM cell Q1 is connected through switch 312a to the gate level voltage source 310 and the input lead 316b of the comparator 317 is connected through the switch 319b to source of lower bound reference current (voltage) 320a. The readout of comparator 317 can be applied to detect whether the response current (voltage) from sense Amp.315 is higher or lower than the lower bound reference current (voltage) $I_{ref}-\Delta I$ ($V_{ref}-\Delta V$). For upper bound verification, the control gate electrode 330 of the NVM cell Q1 is connected through switch 312a to the gate level voltage source 310 and the input lead 316b of the comparator 317 is connected through the switch 319c to a source of upper bound reference current (voltage) 320b. The readout of comparator 317 can be applied to detect whether the response current (voltage) from sense Amp.315 is higher or lower than the upper bound reference current (voltage) $I_{ref}+\Delta I$ ($V_{ref}+\Delta V$).

For reading the stored bit information for level "i", the control gate 330 of the transistor Q1 is connected through switch 312b to the stepped gate voltage source 311 and the reference current (voltage) $I_{ref}$ ($V_{ref}$) from source 318 is applied to input node 316b of comparator 317 by closing switch 319a. When the stepped voltage changes from $S_i$ to $S_{i+1}$, provided by the stepped gate voltage source 311, the output current (voltage) of the sense amp. 315 to the lead 316a of the comparator 317 will make a current (voltage) transition from higher to lower (lower to higher) than the reference current (voltage) $I_{ref}$ ($V_{ref}$) at the other input lead 316b. The output of the comparator 317 will change its state due to this current (voltage) transition. The output state of the same comparator 317 is applied to recognize the stored level and is converted to the bit-word information stored in the NVM cell.

Figure 1:
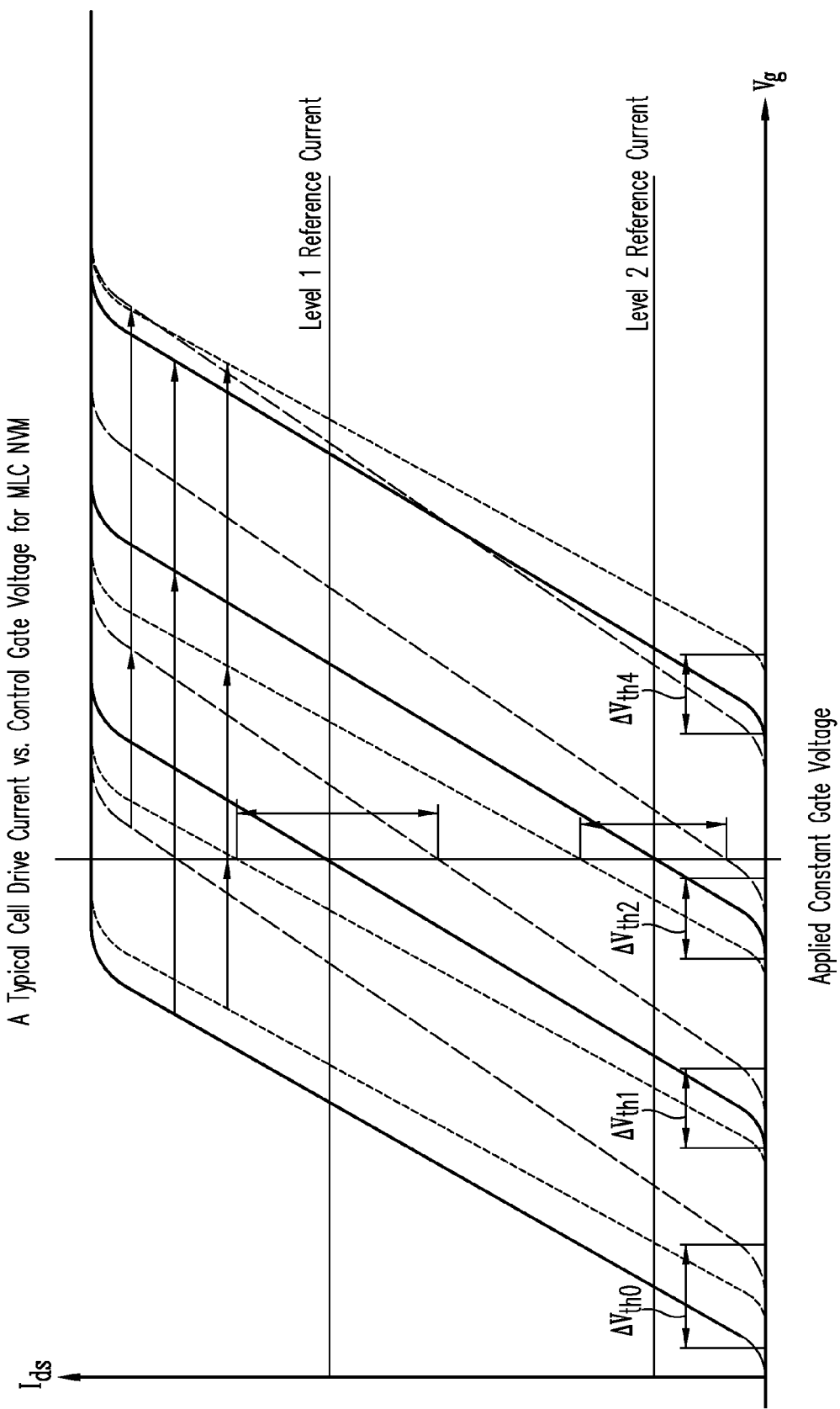
FIG. 1 shows typical drive current vs. control gate voltage curves for NVM cells at four different threshold voltage levels and in particular shows the curves associated with a median slope (the solid curve representing a cell with median transconductance), a steeper slope (the dotted curve representing a cell with maximum transconductance), and a less steeper slope (the dashed curve representing a cell with minimum transconductance) with threshold voltage level variations, $\Delta V_{th0}$, $\Delta V_{th1}$, $\Delta V_{th2}$ and $\Delta V_{th3}$. At the conventional constant gate voltage scheme, as indicated by a vertical line, the current variations (interceptions between vertical line and solid lines, dotted lines, and dashed lines) for the second and third level are very significant to be separated from the first and fourth levels.
Figure 2:
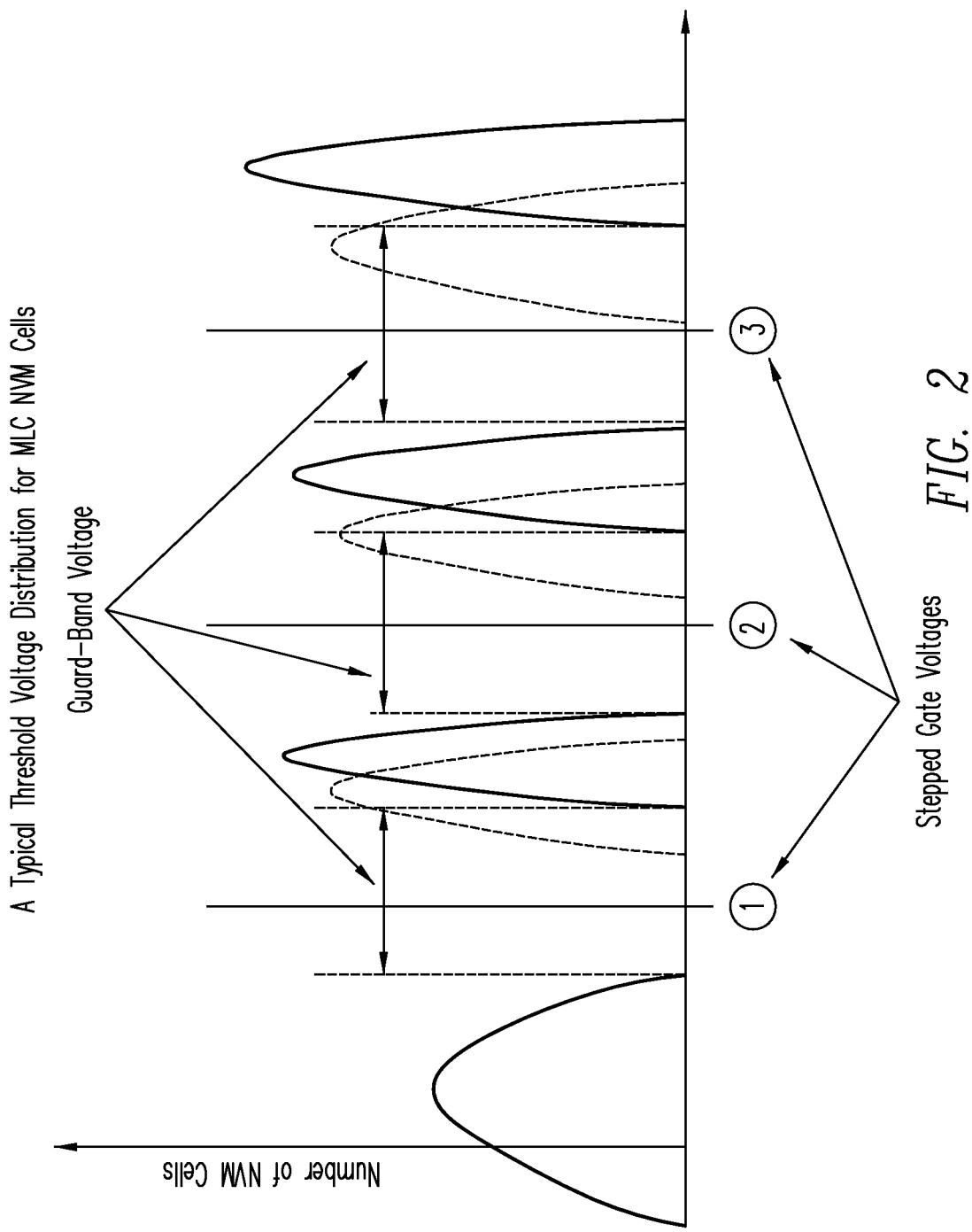
FIG. 2 shows typical threshold voltage distributions for a large number of NVM cells in an array after erase and programming. The solid lines and dotted lines are the original distributions and the distributions after erase-write cycling and high temperature baking, respectively. The stepped voltages 1, 2, and 3 are chosen to include the guard-band voltages for NVM degradation and data retention in the prior art. The information of the stored levels for two bits (4 levels) per NVM cell is obtained by applying three stepped voltages to probe the NVM "on" or "off" state through a combo logic circuitry.

To illustrate the effect of the self-adaptive methods on MLC NVM, we use the same group of $I_{ds}$-$V_g$ curves (solid-curves representing medium transconductance, dotted curves representing maximum transconductance, and dashed curves representing minimum transconductance) in FIG. 1 to parallel move those curves to imitate the programming threshold voltage shifts with the verification method disclosed in this invention in FIG. 4. As clearly seen in FIG. 4 in comparison with FIG. 1, the variation for a gate level voltage can converge to a controllable window. The variation of gate level voltage can be controlled through sense amp. gain and the setting points of the reference current (voltage), and the upper bound reference and lower bound reference currents (voltages).

Figure 5:
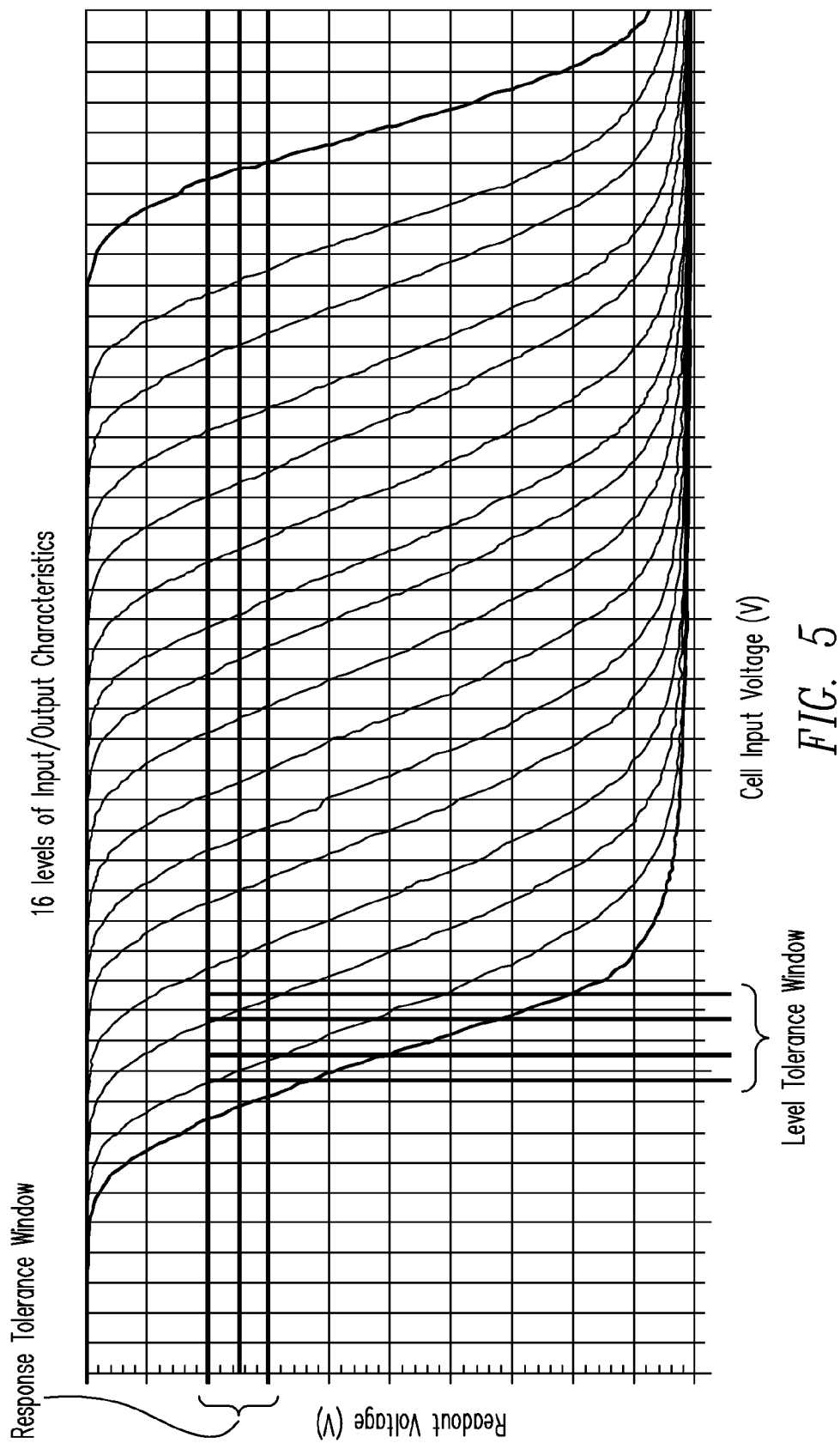
FIG. 5 shows measurement data of sixteen (16) levels of parallel input-voltage/output-voltage characteristics for the NVM cells processed with 0.18 µm technology. The sense circuitry gain is designed to be −1 for convenient conversion between response tolerance window and level tolerance window. The reference voltage is chosen at four-fifths of the bias read voltage for the sense circuitry. The sixteen (16) levels of input/output characteristics are associated with an array of NVM cells having sixteen different possible specified threshold voltage levels representing sixteen possible binary numbers.

To illustrate the preferred embodiment of the self-adaptive and self-calibrated NVM of this invention, the bit-word recognition and verification scheme with inverter-type configuration as disclosed in co-pending U.S. patent application Ser. No. 11/378,074 filed Mar. 16, 2006 and entitled "Bit Symbol Recognition Method and Structure for Multiple Bit Storage in non-Volatile Memories" is informative. This application is assigned to FlashSilicon, the assignee of this patent application, and is incorporated by reference into this application in its entirety. FIG. 5 of the present application shows the measurement data of 16 levels of input/output characteristics of the inverter sense circuitry for NVM cells processed with 0.18 μm technology.

Figure 6:
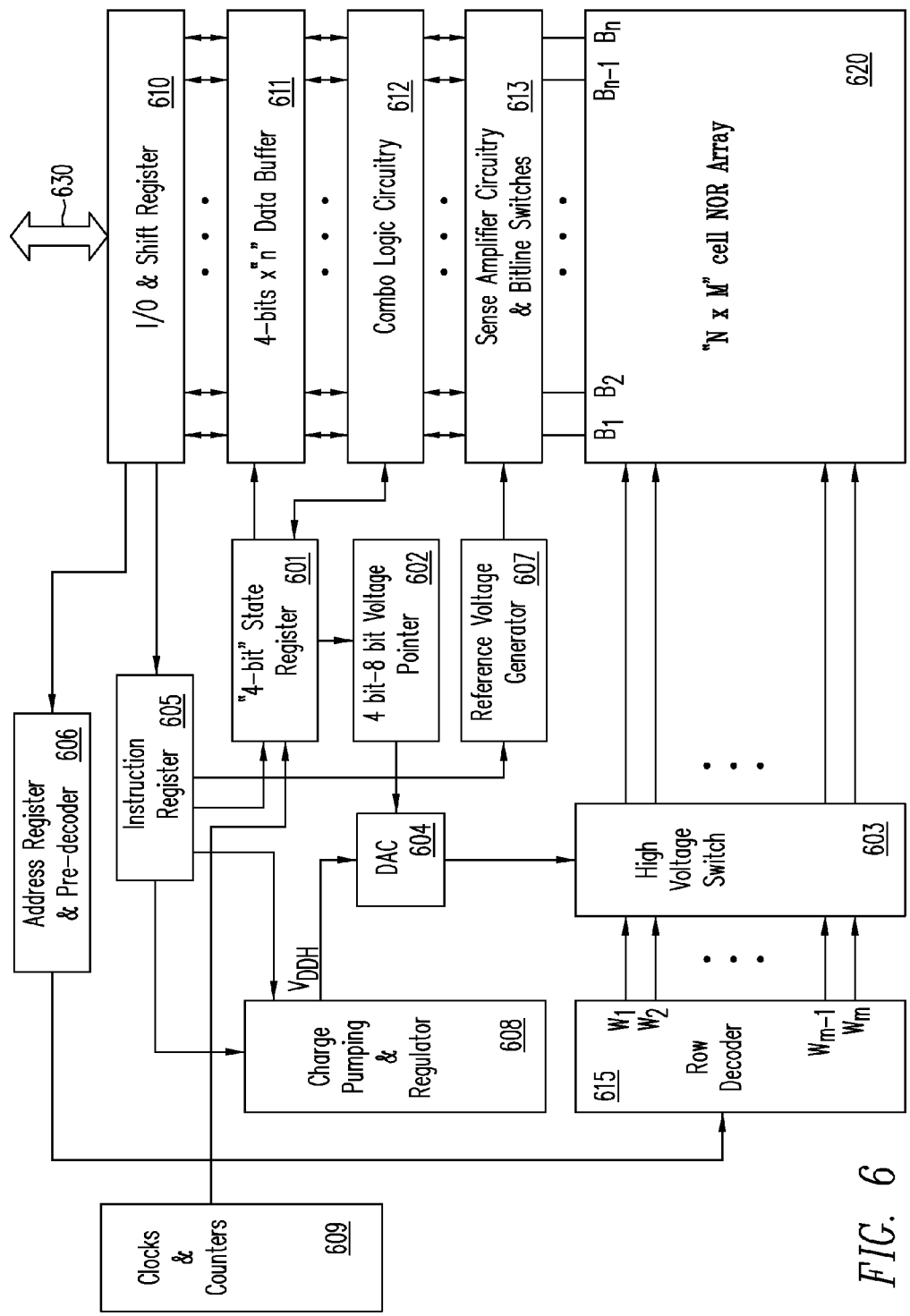
FIG. 6 shows a "m rows"בn columns" NOR-type of NVM array block diagram. The NOR flash memory cells are programmed, verified, and read in parallel (4×n bits) for a row of n NVM cells. The parallel operations enable a fast read/write throughput.

FIG. 6 shows the block schematic to implement self-adaptive and self-calibrated MLC NVM for an NMOSFET NOR-type NVM array. The NOR-type NVM array is configured with n cells in a row $R_m$ (such as any of rows $R_1$ to $R_M$, where "M" is an integer representing the total number of rows in sector 620 and "m" is an integer given by $1 \leq m \leq M$). Each column Cn of NVM cells (such as any of columns $C_1$ to $C_N$, where N is the maximum number of columns in memory sector 620 and "n" is an integer given by $1 \leq n \leq N$) shares the same sense amplifier in block 613 labeled "Sense Amplifier Circuitry & Bitline Switches" along with the single bitline. Three reference voltages are provided to the sense circuitry from a voltage divider in reference voltage generator 607. The voltage divider in generator 607 is supplied with a reference voltage $V_{ref}$, lower bound reference voltage, $V_{ref}-\Delta V$, and upper bound reference voltage, $V_{ref}+\Delta V$, derived directly from the read voltage supply $V_{DDR}$. The output signals from row decoder 615 which receives a wordline address from wordline address register and pre-decoder 606 are applied to activate the wordline $R_m$ (which corresponds to any one of the rows $R_1$ to $R_M$) through high voltage switch 603. The high voltage switch 603 is used to connect a selected wordline Rm to the output lead of the Digital-to-Analog Converter (DAC) 604 which is biased by high voltage supply $V_{DDH}$ from charge pumping and regulator circuitry 608 for programming and reading.

The I/O and shift register block 610 receives and stores instructions to instruction register 605, wordline address to address register block 606, and input data to be stored, and ships out on bus 630 the read data from the data buffer 611. The combo logic circuitry block 612 receives the readouts of the comparators from sense circuitry and bitline switch 613 and a "4 bit state" from the 4-bit state register 601 to activate the selected bitlines for programming, verification, and read. The 4-bit state register 601 represents a state from minimum state of (0,0,0,0) to maximum state of (1,1,1,1) during programming and read. The 4-bit state register 601 provides the central state reference for voltage pointer 602 to DAC 604 for programming and verification, and 4-bit storing data to the data buffer 611 for reading. Signals from clock and counters 609 are supplied for synchronization of the operations and to trigger the 4-bit state register.

Erase Mode.

After receiving erase instruction and block address from the I/O block 610, the NOR array is in erase mode. For the erase operation, the NOR array can be operated in a sector or a page mode as is well known in the arts. After a sector of the NVM NOR array has been erased, all wordlines in the sector are verified one-row by one-row by a page verification sequence. The page verification sequence applies the first gate level voltage $L_0$ to each wordline, while the reference voltage is switched to the reference voltage (316b, 319a and 318 in FIG. 3) in the sense amplifier and bitline switch block 613. The row of NVM cells for the selected wordline (a page of N NVM cells) is then verified and erased in a well known manner to be below the required threshold voltage.

Programming Mode.

After receiving programming instruction and wordline address from the I/O block 610, the NOR array is in programming mode. For programming, Hot Carrier Injection (HCI) is caused to be applied to a row of NOR NVM cells. In the programming operation, the bit data from the I/O 610 is loaded into 4×N data buffer 611 in parallel. The 4-bit state register starts from the first level (0,0,0,1) incrementally up to the last state (1,1,1,1) in synchrony with the programming step. Every bitline in the array is uniquely aligned with a corresponding 4-bit data buffer in buffer block 611. The state bits are then compared with the bits in each of the 4-bit data buffers corresponding to every bitline in parallel in the NOR array. If there is a match between the bits in the 4 bit state register and the bits in the 4-bit data buffer for a bitline, the corresponding bitline is activated. Meanwhile, the 4-bit state register 601 is converted into an 8-bit DAC input through 4 bit-8 bit voltage pointer 602 to generate a corresponding gate programming voltage $P_i$ for the level voltage $L_i$ for i=1,2, . . . , 15, on the DAC output terminal. The gate programming voltage pulse for this voltage level is transmitted onto the selected wordline through the high voltage switch 603. The bit-matched NVM cells in the selected wordline for the "state" are programmed to the vicinity of the threshold voltage level.

After the coarse programming to the desired threshold voltage level, the bit-matched cells are verified with the lower bound verification sequence. That is, the reference voltage is switched to the lower bound threshold voltage (316b, 319b, 320a in FIG. 3) for the corresponding units for the matched NVM cells in the sense amplifier and bitline switch block 613 and the output voltage of DAC 604 is switched to the gate level voltage $L_i$ for the level "i". The output signal from comparator 317 (FIG. 3) for the corresponding bitline in the sense amplifier circuitry and bitline switch block 613 is fed into the combo logic circuitry 612. The output signals of the logic circuitry 612 are applied to activate the bitlines for the bit-matched cells not meeting the lower bound condition in the threshold voltage increase programming sequence (fine-tune for increasing threshold voltage).

When all the bit-matched cells in the wordline meet the lower bound condition, the upper bound verification sequence is then activated for the bit-matched cells by switching the reference voltage to the upper bound reference voltage (316b, 319c, 320b in FIG. 3) for the corresponding units for the matched NVM cells in the sense amplifier and bitline switch block 613. The selected wordline is supplied with the gate level voltage $L_i$. The output signal from comparator 317 for the corresponding bitline in the sense amplifier circuitry and bitline switch block 613 is fed into the combo logic circuitry 612. The output signals from the logic circuitry 612 are applied to activate the bitlines for those bit-matched cells which do not meet the upper bound condition by applying a threshold voltage decrease programming sequence (fine-tune for decreasing threshold voltage).

When all the bit-matched cells in the wordline meet the upper bound condition, the programming for the selected level is completed and the 4-bit state register 601 is triggered to the next level by the clock and counter block 609.

The above-described programming steps are repeated until the last state (1,1,1,1) is completed. The last state (highest threshold voltage) does not require the upper bound verification. After completing the last state programming, 4×N data bits are stored in a row of N NVM cells for the selected wordline.

Read Mode.

After receiving a read instruction and address from the I/O block 610, the NOR array 620 is in read mode. For a reading operation, the 4-bit state register 601 starts from (0,0,0,0) and is driven incrementally to (1,1,1,0) by a read clock. Through the 4-bit to 8-bit voltage pointer 602 to the input of DAC 604, the output signal from DAC 604 provides gate stepped voltages from $S_1$ to $S_{15}$. In the sense amplifier and bitline block 613, the input leads 316b of the comparators 317 for all the corresponding bitlines are switched to the reference voltage $V_{ref}$ (316b, 319a, 318 as shown in FIG. 3). Initially all the data in the data buffers in block 611 are pre-set to "ones" for the state of (1,1,1,1). The output signals of the comparators 317 are fed into the combo logic circuitry 612. When the output signal of the corresponding comparator changes from its original state to an opposite state in response to the stepped voltages from $S_i$ to $S_{i+1}$, the logic circuitry 612 switches on a transmission gate to pass the "state bits" from the 4-bit state register 601 into the data buffer 611 for the corresponding bitlines. After the data buffer 611 associated with a given bit line is filled, a logic state feedbacks to lock the data buffer to prevent overwriting the data buffer in the subsequent sequential steps. When the applied wordline voltage switches from the stepped voltage S14 to the last step voltage S15 on the selected wordline, (1,1,1,0) is written to the data buffer in the same way as the other states were written to the data buffer, while the logic state for (1,1,1,1) is by the preset value of (1,1,1,1) and determined by the condition that the output signal of the comparator 317 in block 613 for the corresponding bitline never changes its original state in response to all the step voltages, $S_1, \ldots, S_{15}$. After completing the 15 cycles of the stepped voltages to the whole row of N NVM cells for the selected wordline, the data buffer block 611 is filled with 4×N bits of data. Parallel reading of a row of NVM cells for a selected wordline provides a fast read throughput.

Self Calibration.

After receiving self-calibrated instruction from the I/O and shift register 610, the device is in self-calibration mode. In the self-calibration operation, the data in a row of NVM cells for the selected wordline is read and stored in the data buffer 611 in much the same manner as in the read operation. Instead of sending out the data to the I/O and shift-register 610 as in the read operation, the verification for the lower bound sequence is activated. The 4-bit state register 601 starts from the (0,0,0,0) state and incrementally goes up to the (1,1,1,1) state. The output signal from DAC 604 generates level voltage $L_i$ corresponding to the state of the digital signal from the 4-bit register 601. When the data in the 4-bit data buffer/register 601 matches the state bits in the buffers in block 611 representing the data stored in certain cells connected to a selected wordline, the bitline for each such cell is activated for lower bound verification. If the threshold voltages of the bit-matched NVM cells are below the lower bound threshold voltage, a fine-tuning increase threshold voltage sequence is applied to move the threshold voltages of the bit-matched NVM cells until their threshold voltages meet the lower bound condition. The procedure is the exact same as the lower bound verification and fine-tuning process in the programming sequence. After completing the recalibration for all levels, the data in the NVM cells are restored.

NAND-Type NVM Array.

Figure 7:
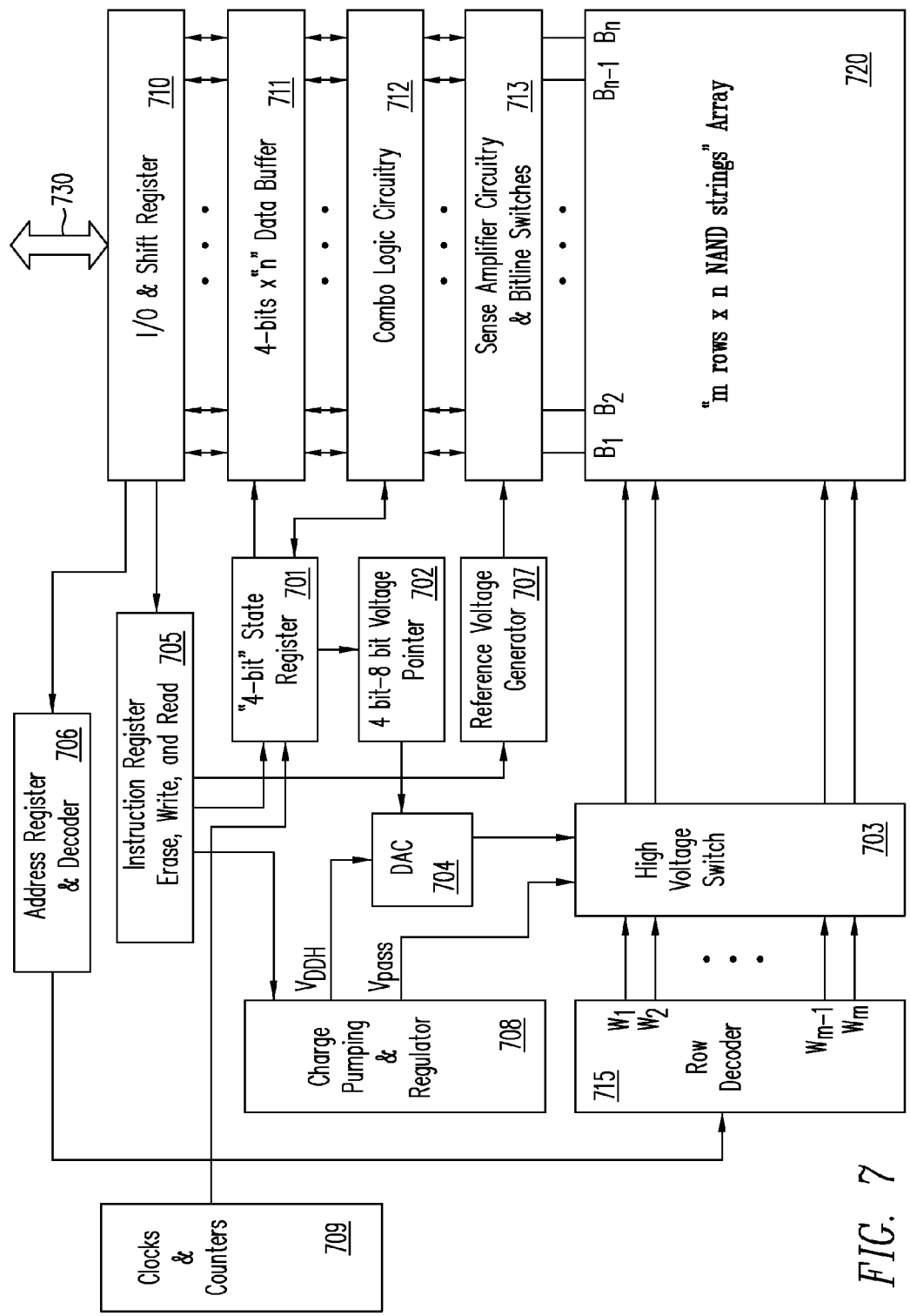
FIG. 7 shows a "m rows"בn strings" of a NAND-type of NVM array block diagram. Each NAND string consists of m NVM cells. The NAND flash memory cells are programmed, verified, and read in parallel (4×n bits) for a row of n NAND strings.

FIG. 7 shows the block schematic to implement a self-adaptive and self-calibrated MLC NVM for an NMOSFET NAND-type NVM array. The NAND-type NVM array is configured with N NAND strings. Each NAND string consists of M NVM cells connected in series. Thus the wordlines in the array are from rows $R_1$ to $R_M$, where "M" is an integer representing the total number of cells in a NAND string in sector 720 and "m" is an integer given by $1 \leq m \leq M$. NAND strings form columns from $C_1$ to $C_N$, where N is the number of NAND strings in memory sector 720 and "n" is an integer given by $1 \leq n \leq N$. Every NAND string represents a bitline and is connected to a sense circuitry unit inside the sense amplifier circuitry and bitline switch block 713. Three reference voltages are provided to the sense circuitry from a voltage divider in reference voltage generator 707. The voltage divider in generator 707 generates a reference voltage $V_{ref}$, a lower bound reference voltage, $V_{ref}-\Delta V$, and an upper bound reference voltage, $V_{ref}+\Delta V$, derived directly from the read voltage supply $V_{DDR}$. The output signals of row decoder 715 receiving a wordline address from wordline address register and pre-decoder 706 are applied to activate the wordlines $R_m$ through high voltage switch 703. The high voltage switch 703 is used to connect a selected wordline Rm to the output lead of the Digital-to-Analog Converter (DAC) 704 which is biased by high voltage supply $V_{DDH}$ from charge pumping and regulator circuitry 708 for programming and reading. The unselected wordlines are connected to a passing gate voltage $V_{pass}$ from the charge pumping and regulator circuitry 708 through the high voltage switch 703. The passing gate voltage $V_{pass}$ applied to the unselected wordlines must be high enough to fully turn on the NVM cells along the NAND string even with the highest programmed threshold voltage.

The I/O and shift register block 710 receives and stores instructions to instruction register 705, wordline address to address register block 706, and input bit data to be stored, and ships out the read bit data from the data buffer block 711. The combo logic circuitry block 712 receives the readout signals from the comparators (such as comparator 317 in FIG. 3) from sense circuitry and bitline switch 713 and digital signals representing the "4 bit state" in the 4-bit state register 701 to activate the selected bitlines for programming, verification, and read. The 4-bit state register 701 provides signals representing a "state" reference from minimum state of (0,0,0,0) to maximum state of (1,1,1,1) during programming and read. The 4-bit state register 701 provides the central state reference voltage through voltage pointer 702 to DAC 704 for programming and verification, and 4-bit information to the 4-bit data buffer in the data buffer block 711 for reading. A synchronizing signal from clock and counters 709 is applied for synchronization of operations and to trigger the 4-bit state register.

Erase Mode.

After receiving erase instruction and block address from the I/O block 710, the NAND array 720 is in erase mode. Fowler-Nordheim (FN) tunneling is applied to erase NAND NVM array 720. For the erase operation, the NAND array can be operated in a sector or a page mode as is well known in the art. After a sector of NVM NAND array has been erased, all wordlines in the sector are verified one-row by one-row by a page verification sequence. The page verification sequence applies the first gate level voltage $L_0$ to each wordline, while the reference voltage is switched to the reference voltage (316b, 319a and 318 in FIG. 3) in the sense amplifier and bitline switch block 713. The row of NVM cells for the selected wordline (a page of N NVM cells) is then verified and erased to be below the desired threshold voltage.

Programming.

After receiving a programming instruction and wordline address from the I/O block 710, the NAND array is in programming mode. For programming, the channel Fowler-Nordheim (FN) tunneling method is applied to a row of NAND NVM cells for the selected wordline. The unselected wordlines on the NAND strings are supplied with the passing gate voltage $V_{pass}$ to be electrically connected to the unselected NVM cells in the NAND strings. The channel Fowler-Nordheim (FN) programming method comprises applying to the control gate of each memory cell large incremental threshold voltage sequences and small incremental threshold voltage sequences by varying the applied gate voltages. The large incremental threshold voltage sequences and small incremental threshold voltage sequences are for causing large threshold voltage shifts and small threshold voltage shifts, respectively.

In the programming operation, the bit data from the I/O 710 is parallel loaded into 4×N data buffer in data block 711. The 4-bit state register 701 starts from the first level (0,0,0,1) and moves incrementally up to the last state (1,1,1,1) in synchrony with the programming steps. Every bitline in the array is aligned with a corresponding 4-bit data buffer in block 711. The state bits from register 701 are then parallel compared with the bits in the 4-bit data buffers corresponding on a one-to-one basis to every bitline in the NAND array. For the first programming step, the corresponding bitlines the data buffers for which are in a (0,0,0,0) state are connected to a positive voltage on both sides of the NAND string to generate the self-inhibited field for preventing moving the threshold voltage upward. Then a large step channel Fowler-Nordheim (FN) tunneling programming sequence is applied to the selected wordline and the substrate. The result of this programming is that the threshold voltages of the NVM cells except those with the corresponding buffer data (0,0,0,0) are moved to the vicinity of the first threshold voltage level.

After the first coarse programming to the first level, all the NVM cells in the selected wordline except those which have corresponding buffer data (0,0,0,0), are verified with the lower bound verification sequence. Those NVM cells which after verification can not meet the lower bound condition are supplied with small incremental threshold voltage sequences until the lower bound condition is met. Then, the upper verification sequence is applied for the programmed NVM cells. The NVM cells which after upper bound verification can not meet the upper bound condition are supplied with a threshold voltage decrease programming sequence to fine move the threshold voltage downward until the upper bound condition is met. The threshold voltages for all the NVM cells connected to the selected wordline except those with their corresponding buffer holding data (0,0,0,0) are within the window of the first voltage level after completing the first step programming and verification.

Moving the threshold voltage to the second level, the NVM cells connected to the selected wordline with the corresponding buffer data (0,0,0,1) and (0,0,0,0) are supplied the self-inhibited field to prevent their threshold voltage level moving upward during the second level programming. Following the same procedure as for the first level programming, the large incremental threshold voltage sequence moves the programmed cells in the selected wordline with no corresponding buffer data (0,0,0,1) and (0,0,0,0) to the vicinity of the second voltage level. The programmed cells with threshold voltage higher than the second level are verified and fine-programmed to be within the window of the second level in the same manner as described for the first level programming. This procedure is repeated for all threshold voltage levels and for the cells with their corresponding threshold voltage levels according to their 4-bit data in their corresponding data buffers. For the highest threshold voltage level, the upper bound verification is not required. After programming to the highest threshold voltage level, the N NVM cells in the selected wordline (i.e. row) have been programmed to their threshold voltage levels according to the 4-bit information in their corresponding data buffers.

Read Mode.

After receiving read instruction and address from the I/O block 710, the NAND array is in read mode. For reading operation, the 4-bit state register 701 starts with signals representing (0,0,0,0) and produces signals increasing incrementally to (1, 1,1,0) in synchrony with the read clock. Through the 4-bit to 8-bit voltage pointer 702, the output signal from DAC 704 provides gate stepped voltages from $S_1$ to $S_{15}$. In the sense amplifier and bitline block 713, the input signals to the comparators (such as comparator 317 in FIG. 3) for all the corresponding bitlines are switched to the reference voltage (using leads 316b and 318 and switch 319a, as shown in FIG. 3). Initially all the data buffers associated with the bit lines are pre-set to "ones" representing the state of (1,1,1,1). The output signals of the comparators 317 connected to the bit lines are fed into the combo logic circuitry 712. When the corresponding output signal of a comparator changes from its original state to an opposite state in response to the stepped voltages from $S_i$ to $S_{i+1}$, the logic circuitry 712 switches on the transmission gate to pass the "state bit" from the 4-bit state register 701 into the data buffer 711 for the corresponding bitlines. After each data buffer in 711 corresponding to a bitline is filled, a logic state feedbacks to lock each filled data buffer in 711 to prevent overwriting the data buffer in the subsequent sequential steps. When the applied wordline voltage moves from stepped voltage $S_{14}$ to the last step voltage $S_{15}$ on the selected wordline, (1,1,1,0) is written (in the usual way as for other states) to the remaining unfilled data buffers connected to the word line, while the logic state for (1,1,1,1) is the preset value and determined by the condition that the output signal of the comparator 317 for the corresponding bitline never changes its original state in response to all the step voltages, $S_1, \ldots, S_{15}$. After completing the 15 cycles of the stepped voltages to the whole row of N NVM cells for the selected wordline, the data buffer is filled with 4×N bits of data. Parallel reading of a row of NVM cells for a selected wordline provides a fast read throughput.

Self Calibration.

After receiving self-calibrated instruction from the I/O and shift register 710, the device is in self-calibration mode. In the self-calibrated operation, the data in a row of NVM cells for the selected wordline is read and stored in the data buffer in the same manner as in the read operation. Instead of sending out the data to the I/O and shift-register 710 as in the read operation, the verification for the lower bound sequence is activated. The 4-bit state register 701 starts from the (0,0,0,1) state incrementally up to the (1,1,1,1) state. When a 4-bit data buffer 701 for a corresponding cell in the selected wordline is matched with the state bits the bitline is activated for lower bound verification. The selected wordline is applied with the gate level voltage $L_i$ from the output terminal of DAC 704 for the lower bound verification. If the threshold voltages of the bit-matched NVM cells are below the lower bound threshold voltage, a fine-tuning increase threshold voltage sequence is applied to move the threshold voltages of the bit-matched NVM cells to be within the threshold voltage window. The procedure is the exact same as the lower bound verification in the programming sequence. After completing the recalibration for all levels, the data in the NVM cells are restored.

While several embodiments of this invention have been described, other embodiments of this invention will be obvious to those skilled in the relevant arts in view of this disclosure. While the non-volatile memory cells used with this invention have been described as using floating gate transistors to store the information being stored in the memory, other types of non-volatile memories, such as memories storing charge on dielectrics such as a silicon oxide, silicon nitride, and silicon oxide dielectric structure can also be used.

As a feature of this invention, the guard-band voltages between threshold levels ensure that as a memory cell ages the threshold voltage of the memory cell will still depict the proper binary word stored in the memory cell despite shifts in the threshold voltage with time. This ensures that the memory meets its specification over a long lifetime. When the system of this invention is operating on a particular memory cell that has been cycled many times such that the threshold voltage of that memory cell has shifted, the system of this invention is able to detect this shift in threshold voltage and then adjust the amount of charge stored on the floating gate or on the dielectric above the MOSFET channel to bring the operation of the memory cell back within the window that has been designated for the particular value of data being stored on the NVM cell. This invention basically recalibrates the memory cell to bring the memory cell back to within the expected operating ranges of voltage and current. For this reason, this invention is sometimes referred to as using or being a "self-calibrating" method and structure, respectively. In accordance with this invention, the actual performance of a memory cell under normal conditions can be adjusted to bring the memory cell back into the desired specification. Consequently, a memory that would normally be rejected as being outside a specification can now be brought back into specification by the methods and structures of this invention. This invention ensures that the charge placed on the floating gate or on the dielectric above the channel region is always the right amount to bring the threshold response into a desired range.

An added advantage of this invention is that one can control with greater precision the range of currents that can be obtained acceptably for a given threshold voltage and thereby a greater number of detectable voltages can be stored in an NVM cell than previously possible. By reducing the range of currents within which a given binary word can be recognized, more binary words are capable of being stored on a given non-volatile memory cell. Thus by being able to either add or remove charge on an NVM cell to achieve a specified output current for a given threshold voltage which is within the desired range for that threshold voltage, the number of data levels that can be stored on a give non-volatile memory cell can be increased. This increases the number of data levels that can be stored in a non-volatile memory containing a plurality of such memory cells.

Another advantage of this invention is that memory cells that would normally be out of specification can be reprogrammed thereby to bring them within the specification. This reduces the yield loss associated with non-volatile memories. Every non-volatile memory cell that can be reprogrammed to bring the output current within the desired range for the given threshold voltage can be restored to an operating condition in accordance with the methods and structures of this invention. Thus in one embodiment of this invention, each non-volatile memory cell in an array of such cells is programmed using a standard algorithm. After each cell has been programmed however, the output current for the specified threshold voltage to which the cell was programmed is measured and the amount of charge then that has been placed on the floating gate or in the dielectric is then either increased or decreased to bring the output current within the desired range for the specified threshold voltage. This means that if a cell has a thin oxide and therefore has more current than would normally be expected for the given amount of charge being placed on the structure, then the amount of charge on the floating gate can be increased thereby to reduce the current. On the other hand, if the output current is too low for the given charge then the amount of charge can be decreased thereby to increase the output current for the desired voltage. Thus the memory array containing these cells can be salvaged and will not be discarded as performing outside the specification. This results in higher yields and lower costs. This structure is thus self-adaptive and self-calibrated because each cell can be adapted to perform in accordance with the specification even though the cell would be outside of the specification under normal circumstances.

The reprogramming of a cell in accordance with this invention is fast. It takes about one microsecond to reprogram the cell to bring the threshold level of the cell into the desired range. At most, it would take about ten micro-seconds to program 4K memory cells. This means that a four mega cell memory can be programmed in about one hundredth second (0.01 seconds). This is fast. A twenty megabit or two megabyte memory is estimated to be programmable in one second or less.

In summary, disclosed are self-adaptive and self-calibrated methods and structures for non-volatile memory. The self-adaptive and self-calibrated methods and structures can be implemented in both NOR-type and NAND-type flash memory. The self-adaptive and self-calibrated methods and structures dramatically increase the capacity and reliability of multi-level cell non-volatile memories.

What is claimed is:

1. A method of adjusting the threshold voltage of a nonvolatile memory cell having a floating gate or dielectric for receipt and storage of charge and a control gate, the method comprising:

placing a selected amount of charge on said floating gate or dielectric, said selected amount of charge corresponding to a desired threshold voltage for said non-volatile memory cell;

comparing a first output current and a second output current from the memory cell to a first reference current and a second reference current, when a first control voltage and a second control voltage are placed on said control gate, respectively, the first and second control voltages being within a selected range that includes said desired threshold voltage, the first control voltage being greater than said desired threshold voltage and the second control voltage being less than said desired threshold voltage; and adjusting the charge on said floating gate or dielectric, when said first output current exceeds said first reference current, or when said second output current is less than said second reference current.

2. The method of claim 1 wherein the adjusting of the charge on said floating gate or dielectric comprises:

placing additional charge on the floating gate or dielectric to bring said second output current from the nonvolatile memory cell to being equal or greater than said second reference current.

3. The method of claim 1 wherein the readjusting of the charge on the floating gate or dielectric comprises:

reducing the charge on the floating gate or dielectric to bring said first output current from the nonvolatile memory cell to being less than or equal said first reference current.

4. Structure for adjusting the threshold voltage of a nonvolatile memory cell having a floating gate or dielectric for receipt and storage of charge and a control gate, the structure comprising:

means for placing a selected amount charge on said floating gate or dielectric, said selected amount of charge corresponding to a desired threshold voltage for said non-volatile memory cell;

means for comparing a first output current and a second output current from the memory cell to a first reference current and a second reference current, when a first control voltage and a second control voltage are placed on said control gate, respectively, the first and second control voltages being within a selected range that includes said desired threshold voltage, the first control voltage being greater than said desired threshold voltage and the second control voltage being less than said desired threshold voltage; and means for adjusting the charge on said floating gate or dielectric, when said first output current exceeds said first reference current, or when said second output current is less than said second reference current.

5. The structure of claim 4 wherein the means for adjusting the charge on said floating gate or dielectric comprises:

means for placing additional charge on said floating gate or dielectric to bring said second output current from the nonvolatile memory cell to being equal or greater than said second reference current.

6. The structure of claim 4 wherein the means for adjusting the charge on said floating gate or dielectric comprises:

means for reducing the charge on said floating gate or dielectric to bring said first output current from the nonvolatile memory cell to being equal or less than said first reference current.

7. Structure comprising:

an array of nonvolatile memory cells, each nonvolatile memory cell having a floating gate or dielectric for receipt and storage of charge and a control gate;

means for placing a selected amount of charge on the floating gate or dielectric of a selected non-volatile memory cell in the array, said selected amount of charge corresponding to a desired threshold voltage for said selected non-volatile memory cell;

means for comparing a first output current and a second output current from said selected non-volatile memory cell to a first reference current and a second reference current, when a first control voltage and a second control voltage are placed on said control gate, respectively, the first and second control voltages being within a selected range that includes said desired threshold voltage, the first control voltage being greater than said desired threshold voltage and the second control voltage being less than said desired threshold voltage; and means for adjusting the charge on the floating gate or dielectric of said selected non-volatile memory cell, when said first output current exceeds said first reference current, or when said second output current is less than said second reference current.

8. The structure of claim 7 wherein the means for adjusting the charge on the floating gate comprises:

means for placing additional charge on the floating gate or dielectric to bring said second output current from said selected nonvolatile memory cell to being equal or greater than said second reference current.

9. The structure of claim 7 wherein the means for adjusting the charge on the floating gate comprises:

means for reducing the charge on the floating gate or dielectric to bring said first output current from said selected nonvolatile memory cell to being equal or less than said first reference current.

10. The structure of claim 7 further comprising:

means for adding to the charge on the floating gate or dielectric of one or more nonvolatile memory cells in the array should the threshold voltage of said one or more nonvolatile memory cells drop beneath a minimum desired value.

11. A structure comprising:

an array of nonvolatile memory cells arranged in M rows and N columns, each cell in the array being capable of storing any one of a plurality of selected amounts of charge;

a voltage source for applying in sequence a plurality of selected voltages to row m, where m is an integer given by $1 \leq m \leq M$, thereby to store charge in selected ones of the nonvolatile memory cells in said row;

logic circuitry for preventing nonvolatile memory cells in row m not selected to receive said selected voltages from having their stored charge altered as said selected voltages are applied to row m; and circuitry for restoring a desired amount of charge on any one of the memory cells in row m should the charge on said memory cell be reduced; said structure further comprising:

means for causing said voltage source to initially apply voltage increments of a first magnitude to row m and once the charge stored in one or more selected nonvolatile memory cells reaches a certain magnitude, to apply voltage increments of a second magnitude to row m until the desired charge is achieved on the one or more selected nonvolatile memory cells, the second magnitude being smaller than the first magnitude.

* * * * *